US005268610A

United States Patent [19]

Hadimioglu et al.

[11] Patent Number: 5,268,610

[45] Date of Patent: Dec. 7, 1993

[54] ACOUSTIC INK PRINTER

[75] Inventors: Babur B. Hadimioglu, Mountain View; Butrus T. Khuri-Yakub, Palo Alto; Eric G. Rawson, Saratoga, all of Calif.

[73] Assignee: Xerox Corporation, Stamford, Conn.

[21] Appl. No.: 815,731

[22] Filed: Dec. 30, 1991

[51] Int. Cl.[5] ........ H01L 41/08

[52] U.S. Cl. ........ 310/323; 310/365; 310/363; 310/364

[58] Field of Search ........ 310/320, 321, 322, 323, 310/328, 365, 367, 334, 363, 364; 367/162; 346/11, 140 R

[56] References Cited

U.S. PATENT DOCUMENTS

| | | | |
|---|---|---|---|
| 3,505,572 | 4/1970 | Yamashita et al. | 317/334 |
| 3,694,677 | 9/1972 | Guttwein et al. | 310/334 |
| 3,774,717 | 11/1973 | Chodorow | 73/61 R |
| 3,961,293 | 6/1976 | Hartmann et al. | 333/72 |
| 3,983,517 | 9/1976 | Weglein | 333/72 |
| 4,006,438 | 2/1977 | Bennett | 333/72 |
| 4,006,444 | 2/1977 | Quate et al. | 340/15 |
| 4,047,183 | 9/1977 | Taub | 346/140 R |
| 4,056,803 | 11/1977 | White et al. | 340/15 |
| 4,081,769 | 3/1978 | Shreve | 333/72 |
| 4,144,507 | 3/1979 | Shreve | 333/191 |
| 4,166,967 | 9/1979 | Benes et al. | 310/322 |
| 4,259,649 | 3/1981 | deKlerk | 333/144 |
| 4,267,732 | 5/1981 | Quate | 73/606 |
| 4,296,349 | 10/1981 | Nakanishi et al. | 310/334 |
| 4,296,417 | 10/1981 | Markham et al. | 346/75 |
| 4,328,472 | 5/1982 | Grudkowski | 333/141 |
| 4,428,808 | 1/1984 | Weinert et al. | 204/192 C |
| 4,430,897 | 2/1984 | Quate | 73/60 C |
| 4,445,066 | 3/1984 | Nishiyama et al. | 310/364 |
| 4,459,852 | 7/1984 | Chubachi et al. | 73/606 |
| 4,482,833 | 11/1984 | Weinert et al. | 310/313 A |
| 4,575,696 | 3/1986 | Hartmann et al. | 333/154 |
| 4,646,573 | 3/1987 | Stoll | 73/606 |
| 4,706,048 | 11/1987 | Atalar | 333/32 |
| 4,712,037 | 12/1987 | Verbeek et al. | 310/323 |
| 4,734,705 | 3/1988 | Rezanka et al. | 346/1.1 |
| 4,749,900 | 6/1988 | Hadimioglu et al. | 310/334 |
| 4,771,205 | 9/1988 | Mequio | 310/334 |
| 4,785,269 | 11/1988 | Adam et al. | 310/321 |
| 4,907,207 | 3/1990 | Moeckl | 310/324 |
| 4,908,543 | 3/1990 | Sabet-Peyman | 310/334 |
| 4,959,674 | 9/1990 | Khri-Yakub et al. | 346/140 R |
| 4,990,939 | 2/1991 | Sekiya et al. | 346/140 R |

OTHER PUBLICATIONS

"Broad-band electrical matching of transducers for acoustic microscopy," by Z. Zhao, Ultrasonics, 1987 vol. 25 Mar.

"Fabrication of Multilayer Thin-Film Piezoelectric Transducers," by V. Rideout, IBM Technical Disclosure Bulletin, vol. 15 No. 3 Aug. 1972.

*Primary Examiner*—Steven L. Stephan
*Assistant Examiner*—Thomas M. Dougherty
*Attorney, Agent, or Firm*—Rosen, Dainow & Jacobs

[57] ABSTRACT

An acoustic ink printer transducer comprising a piezoelectric layer positioned between two suitable electrode materials. Also, a method for obtaining second harmonic operations from an acoustic ink printer transducer to enable ejection of a number of different ink droplet sizes from the acoustic ink printer thereby facilitating grey scale printing.

7 Claims, 4 Drawing Sheets

ACOUSTIC INK PRINTER

The invention relates to an acoustic ink printer transducer comprising a piezoelectric layer positioned between two suitable electrode materials. The piezoelectric transducer has a fundamental resonant frequency $\omega_o$ and an adjacent resonant harmonic frequency offset from said fundamental resonant frequency by no more than $\pm\omega_o$. The invention also relates to a method for obtaining second harmonic operations from an acoustic ink printer transducer to obtain at least two different ink droplet sizes dispensed by the acoustic ink printer thereby facilitating grey scale printing.

BACKGROUND OF THE INVENTION

U.S. Pat. No. 4,482,833 to Weinert et al. discloses a method of depositing thin films of gold having a high degree of orientation on surfaces previously yielding only unoriented gold by sputtering a layer of glass over the surface of the material followed by depositing a layer of oriented gold over the layer of glass. The additional step of depositing a layer of piezoelectric material over the layer of oriented gold is included to provide piezoelectric material having good orientation due to the oriented gold. The transducer described possesses a layer of glass deposited over a material which previously provided unoriented gold followed by a layer of gold, a layer of piezoelectric material and a top conductive electrode to form a transducer wherein the piezoelectric material has a high degree of orientation. While this reference discloses generally many of the elements of the present invention, it does not recognize the specificity of the thicknesses of the piezoelectric layer and the electrode material layer as is required by the present invention.

U.S. Pat. No. 4,749,900 to Hadimioglu et al. discloses a multi layer acoustic transducer wherein the thickness of the piezoelectric layer is approximately one half the wave length of the acoustic operating frequency. The reference does disclose the use of gold as the top and lower electrodes. But this reference does not disclose the required thickness ratio of a suitable electrode material and piezoelectric layer in order to improve grey scale printing resulting from the use of the improved transducer.

U.S. Pat. Nos. 4,006,444, 4,430,897, and 4,267,732 all to Quate and U.S. Pat. No. 3,774,717 to Chodorow disclose imaging apparatuses that included a transducer coated with a thin layer of gold. Neither the specific structure or use of the present invention is disclosed in these references.

The standard acoustic ink print head embodies a substrate having an acoustic wave generating means which is generally a planar transducer used for generating acoustic waves of one or more predetermined wave lengths. The wave generating means is positioned on the lower surface of the substrate. The transducer noted above is typically composed of a piezoelectric film such as zinc oxide positioned between a pair of metal electrodes, such as gold electrodes. Other suitable transducer compositions can be used provided that the unit is capable of generating plane waves in response to a modulated RF voltage applied across the electrodes. The transducer will be generally in mechanical communication with the substrate in order to allow efficient transmission of the generated acoustic waves into the substrate.

Generally an acoustic lens is formed in the upper surface of the substrate which is used for focusing acoustic waves incident on its substrate side to a point of focus on its opposite side. The acoustic lenses (whether spherical lenses or Fresnel lenses)are generally adjacent to a liquid ink pool which is acoustically coupled to the substrate and the acoustic lens. By positioning the focus point of such a lens at or very near a free surface of the liquid ink pool, droplets of ink can be ejected from the pool.

In the past, to achieve grey levels in acoustic ink printing, two approaches have been identified:

In the first approach, changing the length of the RF (and hence the acoustic) burst increases the droplet size by up to two times from its diffraction-limited minimum diameter of approximately one wave length; the second approach is to vary the number of droplets that are deposited per pixel.

The present invention generally relates to a novel method and means for achieving variable grey levels in acoustic ink printing. More particularly, it relates to an acoustic ink printer having a piezoelectric transducer constructed so that the transducer can generate a sound wave at either its fundamental resonance frequency or at the second harmonic thereof, thereby enabling the ejection of droplets of substantially different diameters.

SUMMARY OF THE INVENTION

As noted above, the present invention provides a novel method and means for changing the droplet diameter ejected by an acoustic ink printer by about a two fold factor. This result is achieved by modifying a piezo transducer to oscillate at half of the even harmonics (including the second harmonic), and not only at the odd harmonics as is usually the case. In this way it is possible to operate an acoustic ink printer transducer not only at its fundamental frequency ($\omega_o$) but also at its second harmonic ($2\omega_o$). The significance of this to acoustic ink printing is that the second harmonic operation enables the formulation and ejection of a droplet of half the diameter of that formed with sound at the fundamental frequency.

The corresponding areas of the paper marks thus differ by a ratio of up to about 1:8, depending on the interaction between the ink and the recording medium. Such a ratio is useful for achieving grey scale in acoustic ink printing. By contrast if only the first and third harmonic were available, as is usually the case, the ratio of the paper marks, area would be about 1:27, not as useful a ratio for achieving grey scale in acoustic ink printing.

Importantly, the improved transducer for acoustic ink printing applications is obtained by loading the transducer with a plated metal top electrode that is a quarter wave thick at the transducer's fundamental frequency. With such a structure, one reduces the thickness of the piezoelectric film used in the transducer to one half that currently required, that is, from $\lambda/2$ to essentially $\lambda/4$.

More particularly, the invention comprises loading the piezoelectric film of a transducer for an acoustic ink print head with a $\lambda/4$ thickness of a suitable electrode material, such as gold, so that the thickness of the piezoelectric film can be reduced by a factor of two from $\lambda/2$ (conventional) to $\lambda/4$ (new) where $\lambda$ is the fundamental frequency of the transducer. The benefits of such construction include a corresponding reduction in electrical resistance of the top electrode which increases the uniformity of sound production when such top electrode is a segment of a transmission line that is used to distribute RF energy to multiple transducers of a multi ejector print head.

The thinner piezoelectric films can be deposited in less time, and in many instances, will thus have superior crystalline quality because of reduced internal strain.

A fuller understanding of the invention may be had by referring to the following description and claims taken in conjunction with the accompanying drawings.

DETAILED DESCRIPTION OF THE PREFERRED EMBODIMENTS

Figure 1:
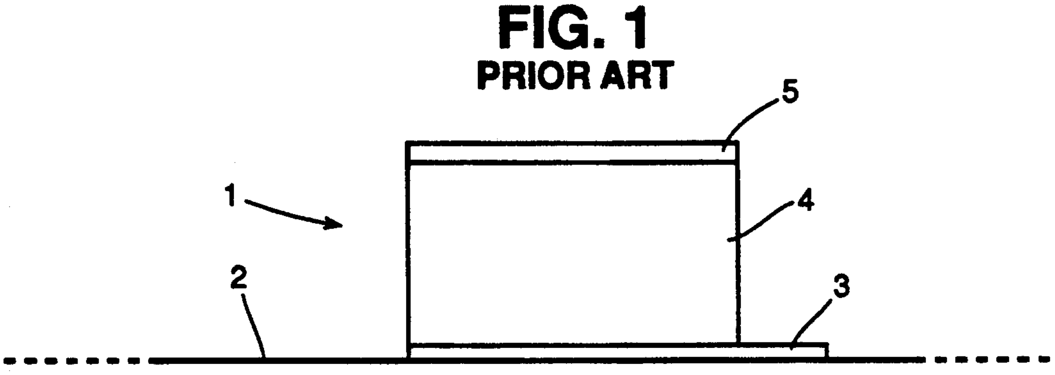
FIG. 1 PRIOR ART
FIG. 1 shows a conventional piezoelectric transducer known in the art.

Referring to FIG. 1, there is shown a conventional piezoelectric transducer 1 comprising substrate 2, a metal electrode 3 positioned on substrate 2, a piezoelectric metal-oxide layer 4 having a metal electrode 5 on the top thereof. The acoustic impedance at the interface between piezoelectric layer 4 and top electrode 5 is approximately zero. Further, as is generally the case, it is assumed that the impedance of substrate material 2 is lower than that of piezoelectric layer 4 and that the impedance of piezoelectric layer 4 is in turn lower than that of electrodes 3 and 5. This is generally true in the acoustic ink printing art, where substrates such as glass, fused quartz and silicon have normalized impedances of approximately 12, 14, and 20, respectively. These substrate impedances are lower than piezoelectric materials (ZnO, PZT, with normalized impedance of 36, 35, respectively) which are in turn lower than the normalized impedance of gold which is equal to about 63.

Normally, as depicted in FIG. 1, transducers are made from a piezoelectric material having a thickness of $\lambda/2$. The piezoelectric material is generally zinc oxide and the top and bottom electrodes 5 and 3, respectively, are acoustically thin layers of metal such as gold.

For example, a halfwave thickness of zinc oxide is about 18 $\mu m$ for a typical acoustic ink printing acoustic frequency of 160 MHz. In this case the mass of the top electrode 5 is negligible and does not appreciably affect the acoustic impedance at the top surface of the zinc oxide piezoelectric layer. This top surface, being free, presents an impedance of essentially zero. Thus, the $\lambda/2$ zinc oxide layer is resonant at $\omega_o$. The reason for this result is that when the E-field polarity causes the piezoelectric layer to thicken, the top surface moves up a substantial amount (against air) and the bottom surface moves down to a lesser extent against the lower impedance substrate. Thus, the sound wave at the piezoelectric top surface is 180° out of phase with the sound wave at the bottom of the piezoelectric surface. However, when the wave due to the top surface oscillation travels the $\lambda/2$ distance to the bottom surface, it is again in-phase. However, at the second harmonic, that same top surface wave undergoes a full $\lambda$ phase shift, rendering it out of phase with the lower surface wave, thereby suppressing resonance at the second harmonic.

Figure 2:
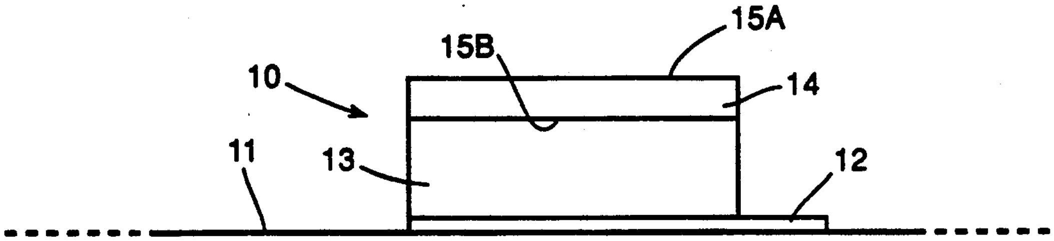
FIG. 2 shows a piezoelectric transducer according to one embodiment of the present invention.

Referring to FIG. 2, there is shown the novel piezoelectric transducer 10 of the present invention comprising substrate 11 such as glass, a thin metal (Au or Ti-Au) bottom electrode 12, a metallic oxide (ZnO) piezoelectric layer 13 and metal (Au) top electrode 14. In accordance with the present invention the top electrode 14, which has a top surface 15A and a bottom surface 15B, is thickened to an acoustic thickness of $\lambda/4$, thus forming a high reflectance layer. The effect of summing, at the piezoelectric top surface, the reflected waves from 15A and 15B is equivalent to canceling the sound wave; in other words, canceling of the sound waves is equivalent to the presence of a very high acoustic impedance. In such an event, the top surface of piezoelectric layer 13 is nearly immobilized; that is, the impedance at the top surface of piezoelectric layer 13 is effectively infinite.

The condition for resonance with an infinite impedance at the top surface of the piezoelectric layer is that the piezoelectric layer will have an acoustic thickness of $\lambda/4$.

In accordance with the present invention, it follows that, at the second harmonic $2\omega_o$, the top electrode 14 becomes a half wave thick. Under this circumstance, the impedance at the top electrode 14-piezoelectric layer 13 interface becomes effectively zero, as it was when the top electrode 14 thickness was substantially as depicted in FIG. 1 above.

Similarly the piezoelectric layer becomes a halfwave thick as it was in FIG. 1 above. The unexpected result is that the structure depicted in FIG. 2, unlike that of the prior art shown in FIG. 1, is resonant at the second harmonic.

Experimental work performed at the higher harmonics confirms that the structure of FIG. 2 is resonant at all odd harmonics and at half the even harmonics, that is, at the second, sixth, tenth, etc.

Although zinc oxide is the preferable material for use in accordance with the present invention, other materials such as lithium niobate or cadmium sulfide may be used.

Figure 3:
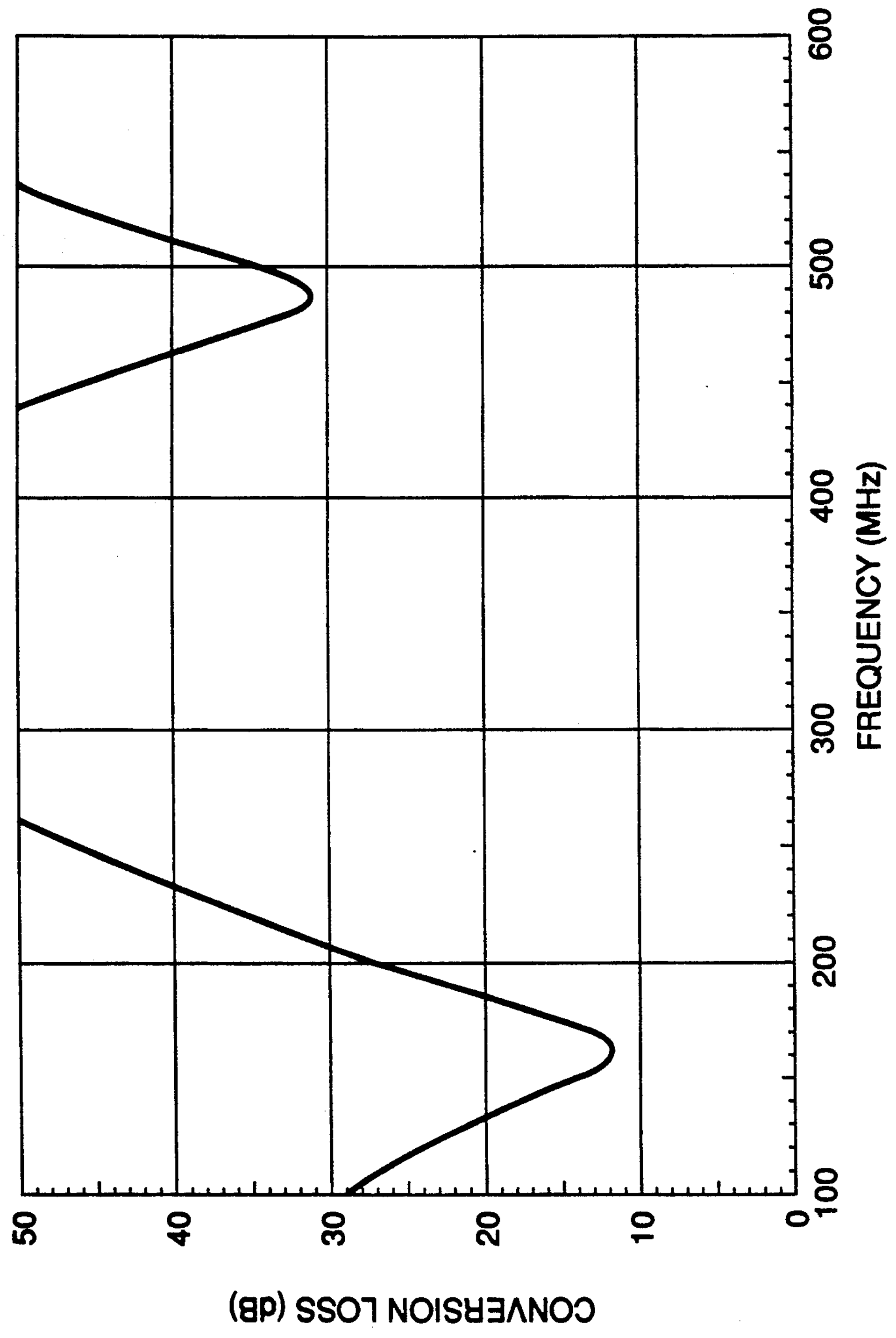
FIG. 3 PRIOR ART
FIG. 3 is a graph showing a theoretical frequency response curve for a prior art ZnO-Au transducer constructed as shown in FIG. 1.

FIG. 3 is a graph showing a computed response curve for a zinc oxide-gold transducer constructed as shown in FIG. 1 having a fundamental resonance, $\omega_o$, near 160 MHz. The graph depicts conversion loss in dB as a function of frequency in MHz. It can be seen that resonances occur at the first and third harmonics but not at the second harmonic as described above.

Figure 4:
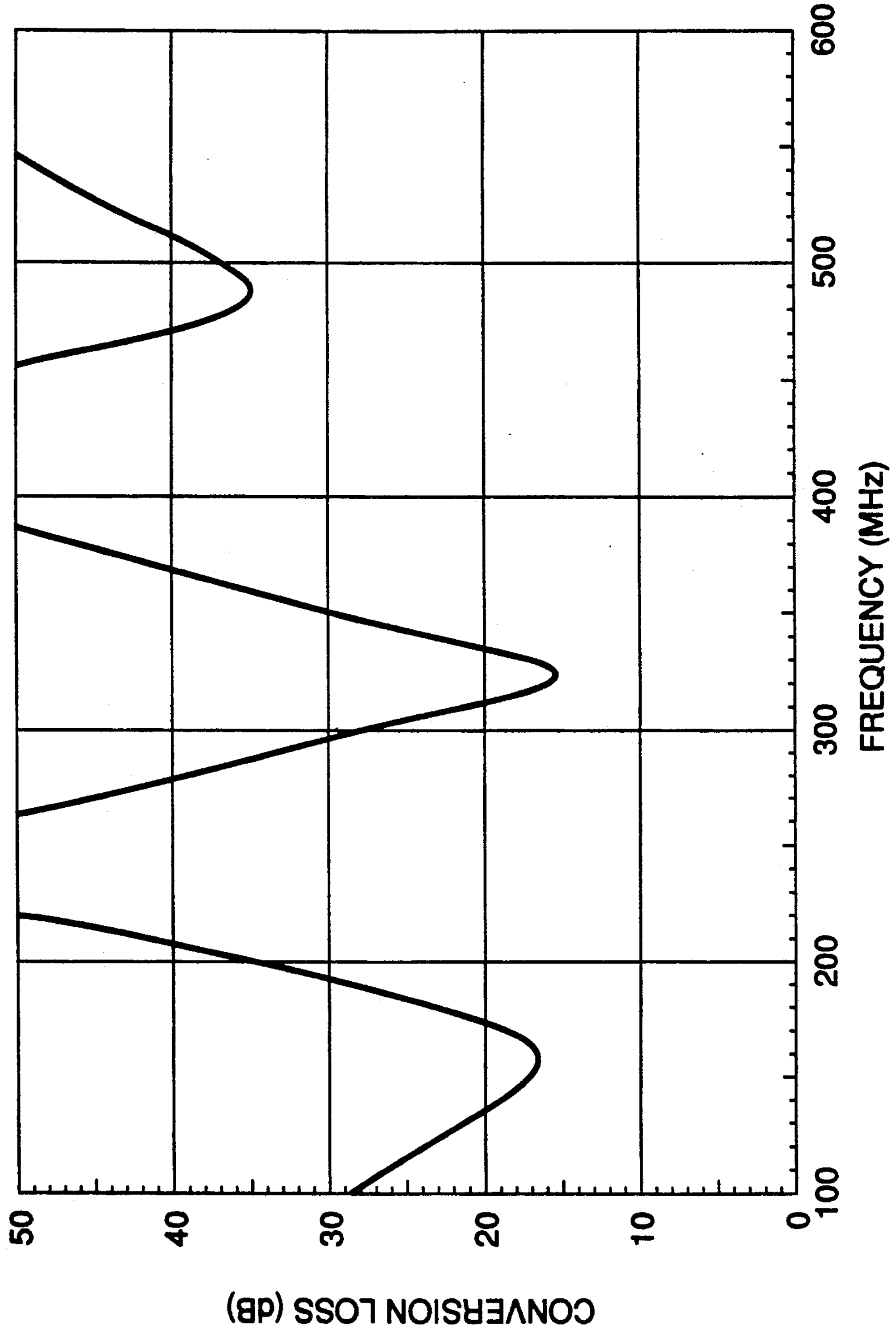
FIG. 4 is a graph showing theoretical response curve for the novel piezoelectric transducer of the present invention.

FIG. 4 is a graph also plotting conversion loss (dB) as a function of frequency (MHz) showing theoretical resonances of a transducer structure constructed in accordance with the present invention as shown in FIG. 2. The graph clearly establishes that the structure is resonant at the first, second and third harmonics as is described above.

Figure 5:
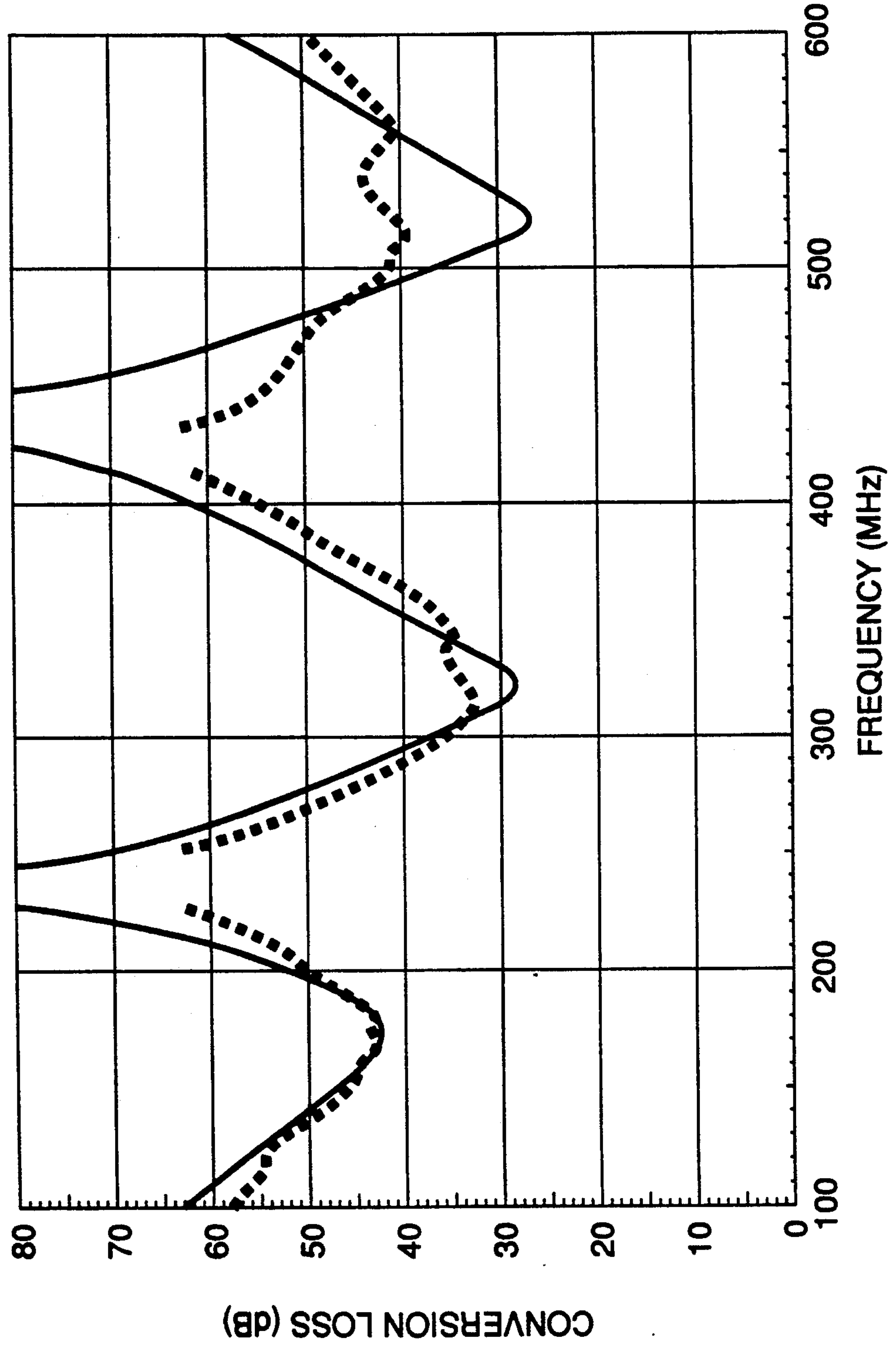
FIG. 5 is a graph showing theoretical and experimental frequency response curves for resonances of the novel piezoelectric transducer of the present invention.

FIG. 5 is a graph also plotting conversion loss (dB) as a function of frequency (MHz) and shows both theoretical and experimental data for resonances of a structure built in accordance with the present invention and as illustrated in FIG. 2. The use of slightly different dimensional parameters accounts for the small differences between the theoretical curve in FIG. 5 and the theoretical curves of FIG. 4. It is apparent that the actual experimental structure is resonant at the first, second and third harmonics and is consistent with the theoretical curve.

Using the transducer described above in an acoustic ink printer, it is possible to obtain second harmonic operation of the transducer which in turn enables marks to be imprinted on the recording medium that differ in area by a ratio of about 1:8, a useful ratio for grey scale printing. By using a variable number of these small droplets per pixel, it is possible to obtain additional incremental adjustability of pixel's grey level.

What we claim and desire to protect by Letters Patent is:

1. The method of ejecting ink droplets in an acoustic ink printer, comprising energizing a transducer having a piezoelectric layer between a first electrode and a second electrode, each of said first electrode and piezoelectric layer having a thickness of $\lambda/4$ of the fundamental frequency of the transducer, to obtain acoustic waves, said step of energizing comprising energizing said transducer to oscillate at the fundamental and second harmonic for controlling the size of ink droplets that are ejected from the transducer.

2. The method of ejecting ink droplets of different sizes in an acoustic ink printer, comprising:

(a) providing in the acoustic ink printer a transducer having a piezoelectric layer between a first electrode and a second electrode, each of said first electrode and piezoelectric layer having thicknesses such that, when energized, the transducers can be caused to oscillate at a fundamental frequency and at at least the second harmonic of said fundamental frequency to obtain acoustic wave;

(b) energizing said transducer to oscillate at the fundamental frequency or the second harmonic for controlling the size of ink droplets that are ejected by the acoustic ink printer.

3. The method of claim 2, wherein the piezoelectric layer and the first electrode each have an acoustic thickness substantially equal to $\lambda/4$, where $\lambda$ equals the wavelength of the fundamental frequency.

4. The method of claim 3, wherein the transducer has a fundamental resonance in the megahertz range.

5. A piezoelectric transducer for acoustically illuminating a substrate, said transducer comprising:

(a) a first electrode layer on said substrate, (b) a piezoelectric layer disposed on said first electrode layer, (c) a second electrode layer disposed on said piezoelectric layer, (d) said second electrode layer having an acoustic thickness of essentially $\lambda/4$ and said piezoelectric layer having an acoustic thickness of essentially $\lambda/4$, where $\lambda$ equals the wavelength of the fundamental resonant frequency of said transducer, whereby said transducer is resonant not only at its fundamental frequency but also at at least its second harmonic frequency when energized.

6. The piezoelectric transducer defined in claim 5, wherein said piezoelectric layer is zinc oxide.

7. The piezoelectric transducer defined in claim 6, wherein the electrode layers are metallic.

* * * * *